(12) United States Patent
Chen et al.

(10) Patent No.: US 12,075,613 B2
(45) Date of Patent: Aug. 27, 2024

(54) BURIED WORD LINE OF A DYNAMIC RANDOM ACCESS MEMORY AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou (CN)

(72) Inventors: Pin-Hong Chen, Tainan (TW); Yi-Wei Chen, Taichung (TW); Tzu-Chieh Chen, Pingtung County (TW); Chih-Chieh Tsai, Kaohsiung (TW); Chia-Chen Wu, Nantou County (TW); Kai-Jiun Chang, Taoyuan (TW); Yi-An Huang, New Taipei (TW); Tsun-Min Cheng, Changhua County (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 234 days.

(21) Appl. No.: 17/570,345

(22) Filed: Jan. 6, 2022

(65) Prior Publication Data
US 2022/0130839 A1 Apr. 28, 2022

Related U.S. Application Data

(62) Division of application No. 15/712,151, filed on Sep. 22, 2017, now Pat. No. 11,251,187.

(30) Foreign Application Priority Data

Aug. 24, 2017 (CN) .......................... 201710733801.2

(51) Int. Cl.
*H10B 12/00* (2023.01)
(52) U.S. Cl.
CPC ........... *H10B 12/488* (2023.02); *H10B 12/34* (2023.02)
(58) Field of Classification Search
CPC ....... H10B 12/488; H10B 12/34; H10B 12/50
See application file for complete search history.

(56) References Cited

U.S. PATENT DOCUMENTS

| 8,173,506 B2 | 5/2012 | Jung et al. |
| 9,236,439 B2 | 1/2016 | Jeong |

(Continued)

FOREIGN PATENT DOCUMENTS

| CN | 103137561 A | 6/2013 |
| CN | 103681804 A | 3/2014 |

(Continued)

*Primary Examiner* — Shahed Ahmed
*Assistant Examiner* — Sun Mi Kim King
(74) *Attorney, Agent, or Firm* — Winston Hsu

(57) ABSTRACT

A method for fabricating buried word line of a dynamic random access memory (DRAM) includes the steps of: forming a trench in a substrate; forming a first conductive layer in the trench; forming a second conductive layer on the first conductive layer, in which the second conductive layer above the substrate and the second conductive layer below the substrate comprise different thickness; and forming a third conductive layer on the second conductive layer to fill the trench.

11 Claims, 5 Drawing Sheets

(56) References Cited

U.S. PATENT DOCUMENTS

| | | | |
|---|---|---|---|
| 2013/0280900 A1* | 10/2013 | Lai | H01L 29/66545 |
| | | | 438/589 |
| 2015/0187899 A1 | 7/2015 | Jeong | |
| 2015/0206963 A1 | 7/2015 | Ho | |
| 2015/0228491 A1* | 8/2015 | Kang | H01L 21/28202 |
| | | | 257/330 |
| 2017/0236821 A1* | 8/2017 | Kim | H01L 29/7856 |
| | | | 257/401 |
| 2017/0294315 A1 | 10/2017 | Deng | |
| 2018/0358448 A1 | 12/2018 | Chiang | |

FOREIGN PATENT DOCUMENTS

| | | |
|---|---|---|
| CN | 104795437 A | 7/2015 |
| JP | 2012-64686 A | 3/2012 |

\* cited by examiner

BURIED WORD LINE OF A DYNAMIC RANDOM ACCESS MEMORY AND METHOD FOR FABRICATING THE SAME

CROSS REFERENCE TO RELATED APPLICATIONS

This application is a division of U.S. application Ser. No. 15/712,151 filed Sep. 22, 2017, and incorporated herein by reference in its entirety.

BACKGROUND OF THE INVENTION

1. Field of the Invention

The invention relates to a method for fabricating semiconductor device, and more particularly to a method for fabricating a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating buried word line of a dynamic random access memory (DRAM) includes the steps of: forming a trench in a substrate; forming a first conductive layer in the trench; forming a second conductive layer on the first conductive layer, in which the second conductive layer above the substrate and the second conductive layer below the substrate comprise different thickness; and forming a third conductive layer on the second conductive layer to fill the trench.

According to another aspect of the present invention, a buried word line of a dynamic random access memory (DRAM) includes a gate structure in a substrate. Preferably, the gate structure further includes: a first conductive layer on the substrate; a second conductive layer on the first conductive layer, wherein the second conductive layer comprises a horizontal portion and two vertical portions and the horizontal portion and one of the two vertical portions comprise different thickness; and a third conductive layer on the second conductive layer.

According to yet another aspect of the present invention, a buried word line of a dynamic random access memory (DRAM) includes a gate structure in a substrate. Preferably, the gate structure includes: a first conductive layer in the substrate; a second conductive layer on the first conductive layer, wherein the second conductive layer is I-shaped; and a third conductive layer on the second conductive layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
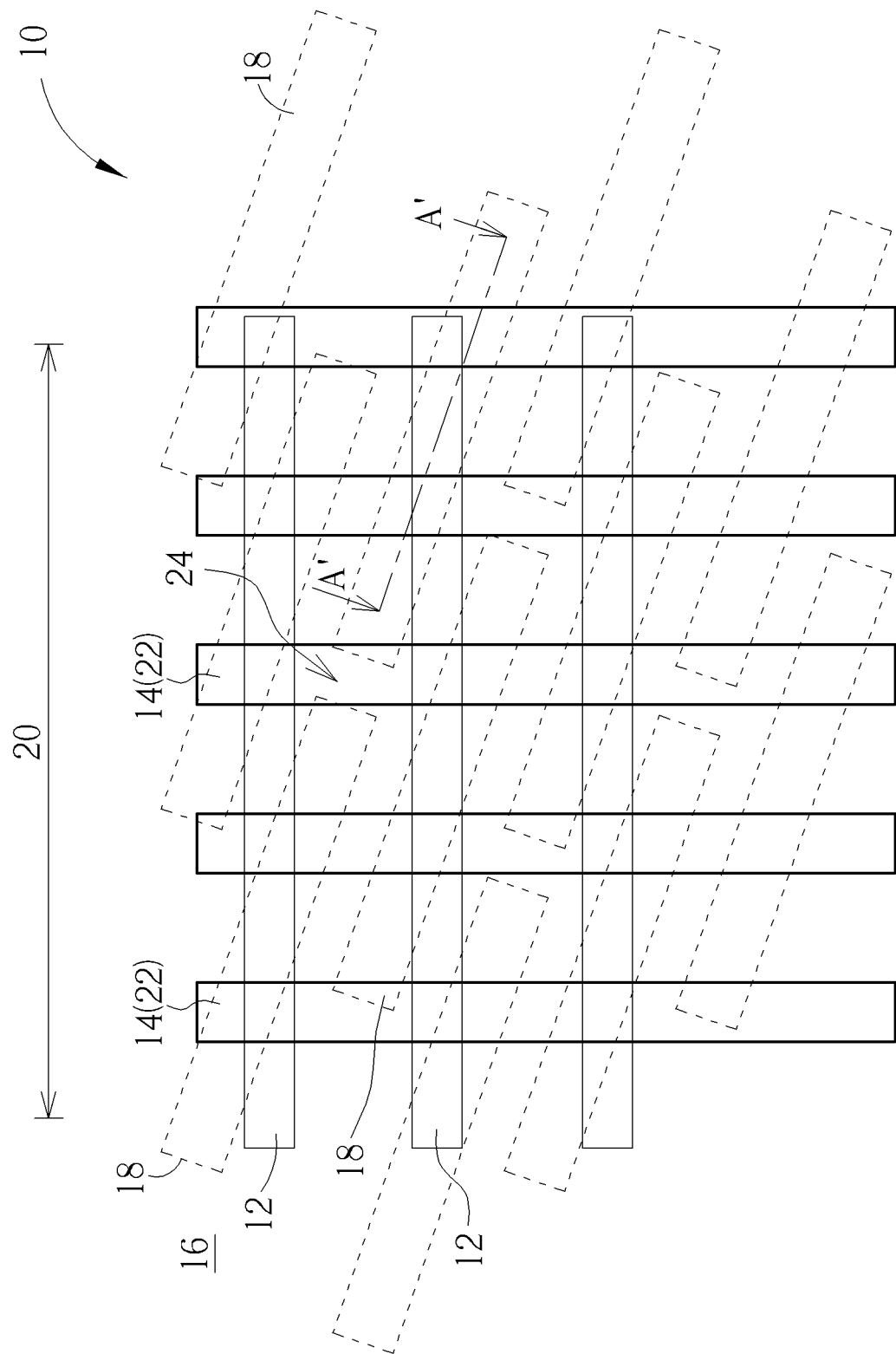
FIGS. 1-7 illustrate a method for fabricating a DRAM device according to an embodiment of the present invention.
Figure 2:
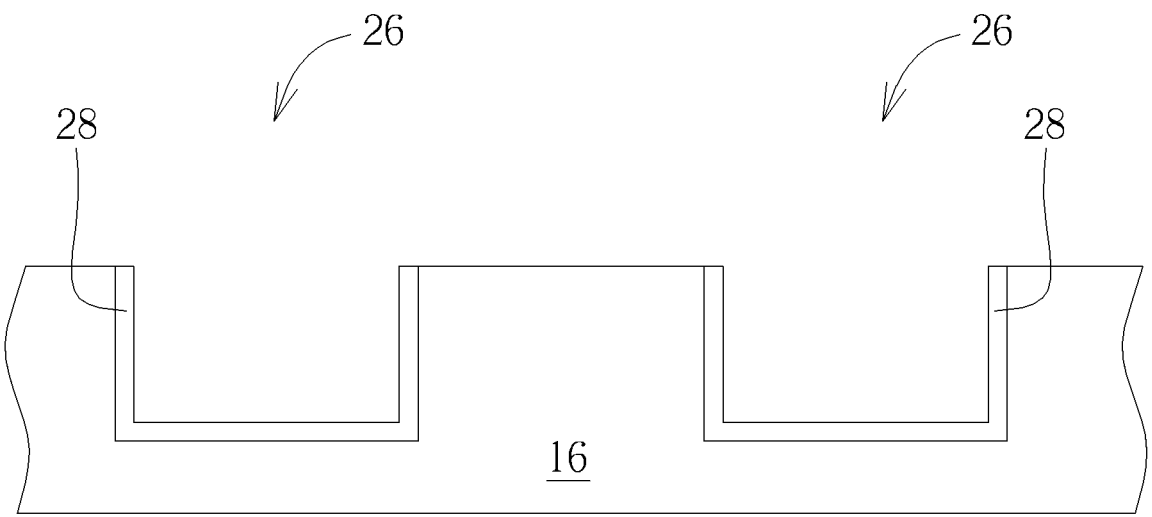

Referring to FIGS. 1-7, FIGS. 1-7 illustrate a method for fabricating a DRAM device according to an embodiment of the present invention, in which FIG. 1 illustrates a top-view diagram of a DRAM device, FIG. 2 illustrates a cross-sectional view of FIG. 1 along the sectional line AA', and FIGS. 3-7 illustrate cross-sectional views following the fabrication of FIG. 2. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines 12 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit lines 12 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STI 24. Preferably, the gates 22 are disposed extending along a second direction, in which the second direction crosses the first direction at an angle less than 90 degrees.

The bit lines 12 on the other hand are disposed on the substrate 16 parallel to each other and extending along a third direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

The fabrication of word lines 14 (or also referred to as buried word lines) is explained below. As shown in FIG. 2, at least a trench or trenches 26 are formed in the substrate 16, and an in-situ steam generation (ISSG) process is conducted to form a gate dielectric layer 28 in the trenches 26.

In this embodiment, the gate dielectric layer 28 preferably includes silicon oxide or high-k dielectric layer depending on the demand of the product, in which the high-k dielectric layer is preferably selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Figure 3:
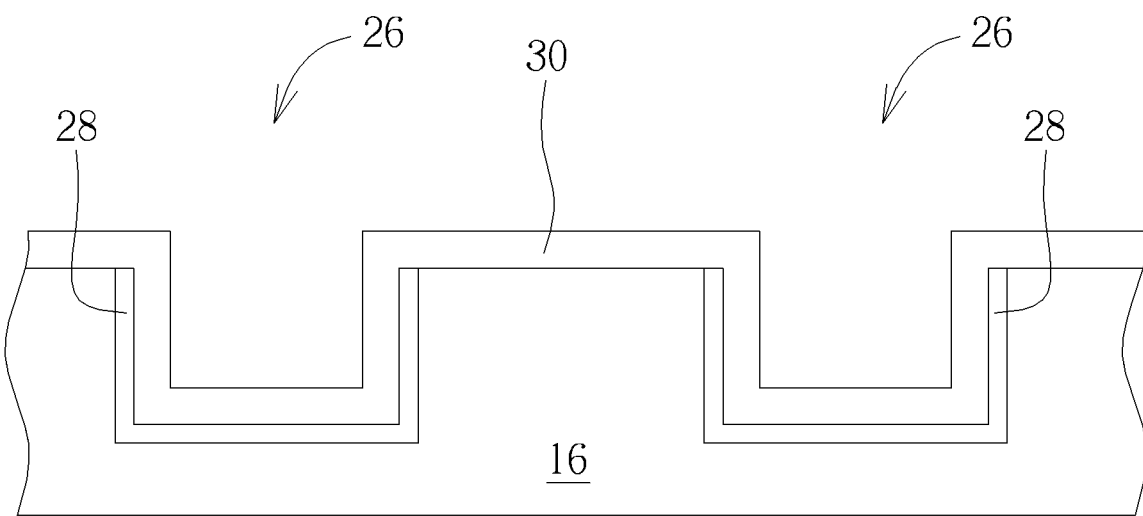

Next, as shown in FIG. 3, a first conductive layer 30 is formed in the trenches 26. In this embodiment, the first conductive layer 30 preferably includes TiN, but not limited thereto. Specifically, the first conductive layer 30 preferably includes a work function metal layer which could be a n-type work function metal layer or p-type work function metal layer depending on the demand of the process or product. In this embodiment, n-type work function metal layer could include work function metal layer having a work function ranging between 3.9 eV and 4.3 eV such as but not limited to for example titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. P-type work function metal layer on the other hand could include work function metal layer having a work function ranging between 4.8 eV and 5.2 eV such as but not limited to for example titanium nitride (TiN), tantalum nitride (TaN), or tantalum carbide (TaC), but not limited thereto.

Preferably, the first conductive layer 30 covers the surface of the substrate 16 and the sidewalls and top surface of the gate dielectric layer 28 evenly, in which the first conductive layer 30 within the trenches 26 and outside the trenches 26 preferably has even thickness. Specifically, the thickness of the first conductive layer 30 on the top surface of the substrate 16 is equal to the thickness of the first conductive layer 30 on the sidewalls of the gate dielectric layer 28 and the thickness of the first conductive layer on a top surface of the gate dielectric layer 28 in the trench 26. Preferably, the thickness of the first conductive layer 30 is between 20-30 Angstroms and most preferably 20 Angstroms.

Figure 4:
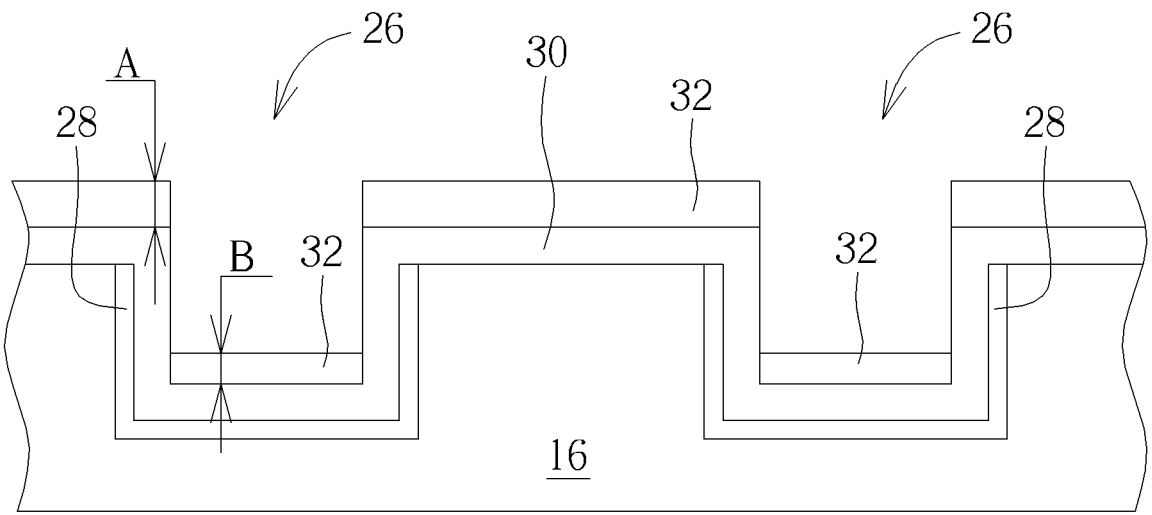

Next, as shown in FIG. 4, a second conductive layer 32 is formed on the first conductive layer 30. Preferably, the second conductive layer 32 is deposited on the first conductive layer 32 through a physical vapor deposition (PVD) process so that the second conductive layer 32 on the substrate 16 and the second conductive layer 32 below the substrate 16 preferably have different thickness. Specifically, the second conductive layer 32 deposited by PVD process could be formed on the top surface of the first conductive layer 30 outside the trenches 26 and the top surface of the first conductive layer 30 within the trenches 26 without forming on the sidewalls of the first conductive layer 30 as shown in FIG. 4, or could be formed not only on the top surface of first conductive layer 30 outside and within the trenches 26 but also on the sidewalls of the first conductive layer 30 as shown in FIG. 5.

According to an embodiment of the present invention, the thickness of the second conductive layer 32 disposed on the top surface of the substrate 16 (or outside the trenches 26) is different from the thickness of the second conductive layer 32 disposed in the trenches 26. Specifically, the thickness of the second conductive layer 32 disposed on the top surface of the substrate 16 is greater than the thickness of the second conductive layer 32 disposed on the top surface of first conductive layer 30 within the trenches 26.

Figure 5:
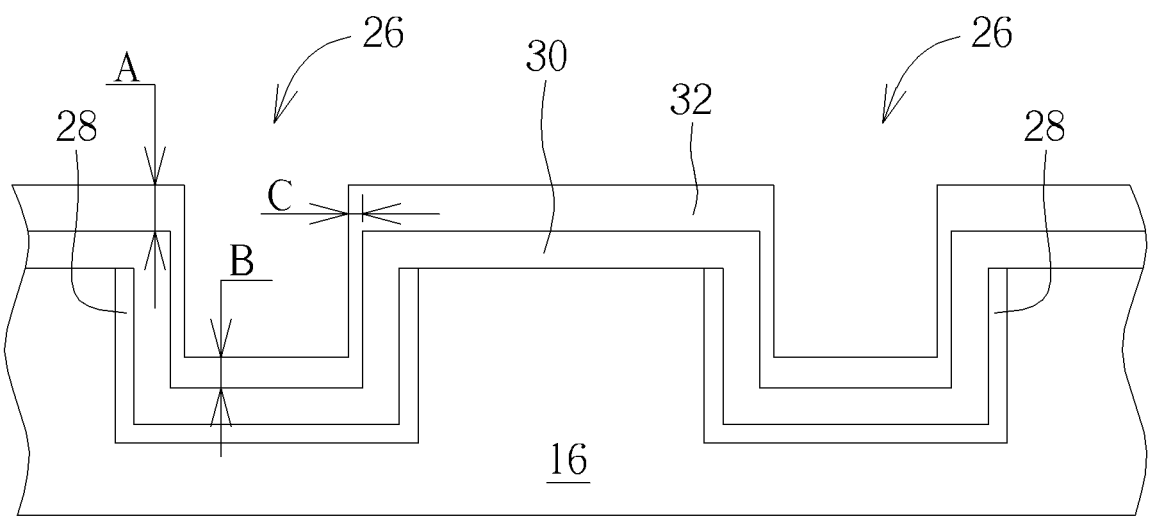

As shown in FIG. 4, the second conductive layer 32 disposed on the top surface of the substrate 16 outside the trenches 26 preferably includes a first thickness A, the second conductive layer 32 disposed on the top surface of the first conductive layer 30 within the trenches 26 includes a second thickness B, and as shown in FIG. 5, if the second conductive layer 32 were also formed on the sidewalls of the first conductive layer 30 the second conductive layer 32 would further include a third thickness C. In this embodiment, the first thickness A is greater than the second thickness B and the third thickness C and the second thickness B is also greater than the third thickness C, in which the first thickness A is preferably between 90-110 Angstroms or most preferably 100 Angstroms, the second thickness B is preferably between 20-30 Angstroms, and the third thickness C is preferably less than 5 Angstroms. Preferably, the second conductive layer 32 and the first conductive layer 30 are made of different material. For instance, the first conductive layer 30 preferably includes TiN while the second conductive layer 32 includes Ti, but not limited thereto.

Figure 6:
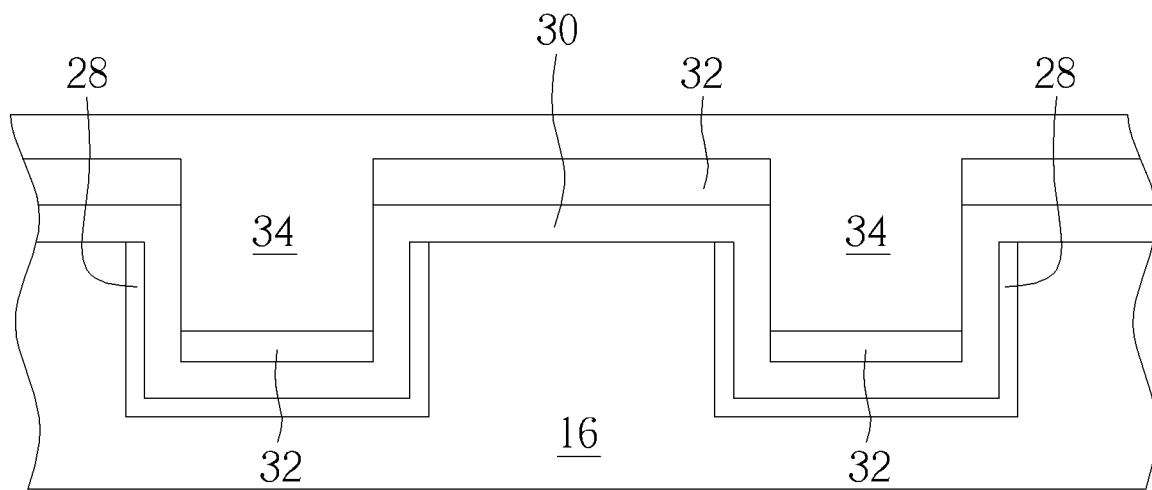

Next, as shown in FIG. 6, an atomic layer deposition (ALD) process is conducted to form a third conductive layer 34 on the second conductive layer 32 and fill the trenches 26 completely, and a thermal treatment process is conducted to lower the resistance of the conductive layers during deposition process. In this embodiment, the third conductive layer 34 preferably includes cobalt (Co) and the temperature of the thermal treatment process is preferably between 250° C. to 500° C., but not limited thereto.

Figure 7:
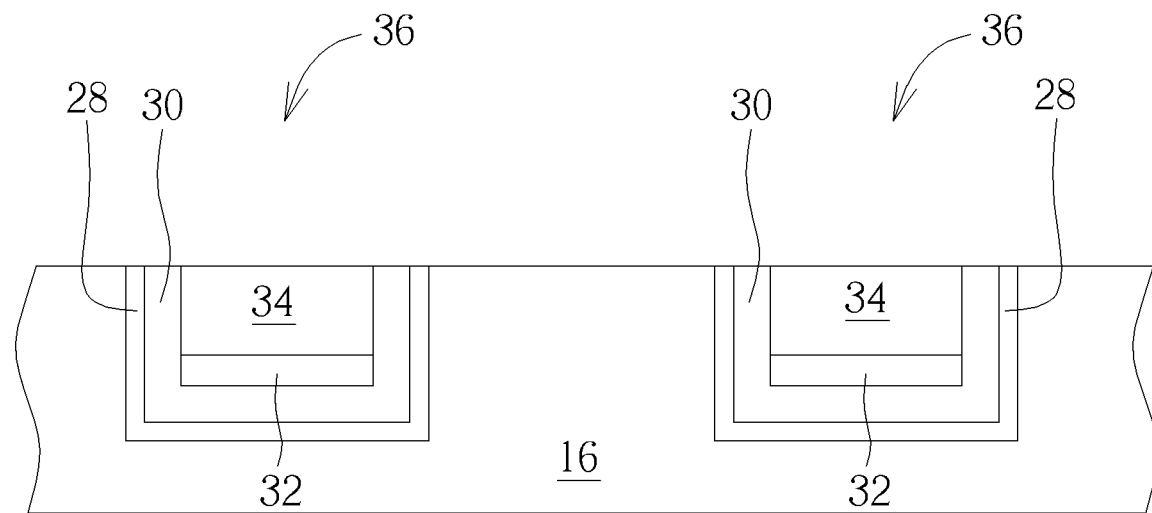

Next, as shown in FIG. 7, a planarizing process such as chemical mechanical polishing (CMP) process is conducted to remove part of the third conductive layer 34, part of the second conductive layer 32, and part of the first conductive layer 30 to form gate structures 36 in the trenches 26, in which the gate structures 36 then become the word lines 14 shown in FIG. 1. Next, an ion implantation process could be conducted depending on the demand of the process to forma doped region (not shown) such as lightly doped drain or source/drain region in the substrate 16 adjacent to two sides of the gate structures 36. Next, a contact plug process could be conducted to form bit line contacts adjacent to two sides of the gate structures 36 electrically connecting the source/drain region and bit lines formed thereafter and storage node contacts electrically connecting the source/drain region and capacitors fabricated in the later process.

Referring again to FIG. 7, FIG. 7 further illustrates a structural view of a buried word line of a DRAM according to an embodiment of the present invention. As shown in FIG. 7, the buried word line preferably includes at least a gate structure 36 embedded within the substrate 16, in which the gate structure 36 preferably includes a first conductive layer 30 disposed in the substrate 16, a gate dielectric layer 28 disposed between the first conductive layer 30 and the substrate 16, a second conductive layer 32 disposed on the first conductive layer 30, and a third conductive layer 34 disposed on the second conductive layer 32. Specifically, each of the gate dielectric layer 28 and first conductive layer 30 is U-shaped while the second conductive layer 32 is I-shaped, in which the thickness of the I-shaped second conductive layer is preferably between 20-30 Angstroms.

The first conductive layer 30, the second conductive layer 32, and the third conductive layer 34 are preferably made of different material, in which the first conductive layer 30 preferably includes TiN, the second conductive layer 32 preferably includes Ti, and the third conductive layer 34 preferably includes Co.

Figure 8:
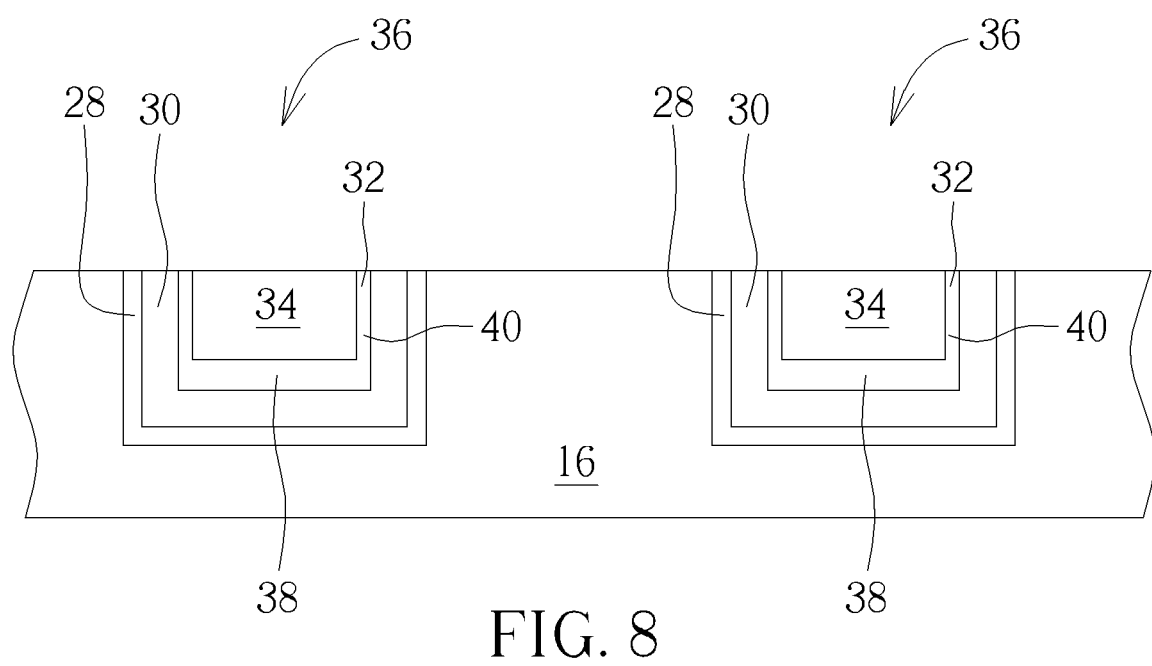
FIG. 8 illustrates a structural view of a buried word line of a DRAM according to an embodiment of the present invention.

Referring to FIG. 8, FIG. 8 illustrates a structural view of a buried word line of a DRAM according to an embodiment of the present invention. According to an embodiment of the present invention, if the second conductive layer were deposited not only on the top surface of first conductive layer 30 outside and within the trenches 26 but also on the sidewalls of the first conductive layer 30, it would be desirable to follow similar processes as disclosed in FIGS. 6-7 to form a third conductive layer 34 on the second conductive layer 32, perform a thermal treatment process, and conducting a planarizing process to remove part of the third conductive layer 34, part of the second conductive layer 32, and part of the first conductive layer 30 to obtain the structure as shown in FIG. 8.

As shown in FIG. 8, the buried word line also includes at least a gate structure 36 embedded in the substrate 16, in which the gate structure 36 includes a first conductive layer 30 in the substrate 16, a gate dielectric layer 28 between the first conductive layer 30 and the substrate 16, a second conductive layer 32 on the first conductive layer 30, and a third conductive layer 34 on the second conductive layer 32.

Specifically, the gate dielectric layer 28, the first conductive layer 30, and the second conductive layer 32 in this embodiment are all U-shaped. Preferably, the second conductive layer 32 in particular includes a horizontal portion 38 and two vertical portions 40, in which the horizontal portion 38 and one of the two vertical portions 40 have different thicknesses. For instance, the thickness of the horizontal portion 38 is preferably between 20-30 Angstroms while the thickness of each of the vertical portions 40 is less than 5 Angstroms.

Overall, the present invention first forms at least a trench in the substrate, deposits a first conductive layer preferably made of TiN into the trench, and then forms a second conductive layer preferably made of Ti on the first conductive layer through PVD process, in which the thickness of the second conductive layer within the trench preferably less than the thickness of the second conductive layer outside the trench or on the top surface of the substrate. Thereafter, a third conductive layer made of cobalt is deposited through ALD process to fill the trench and a thermal treatment process is conducted to repair gaps between lattice structures. This provides a buried word line structure with defect free and enhanced smooth surface as well as a device with better resistance under small critical dimension environment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating buried word line of a dynamic random access memory (DRAM), comprising:
   forming a trench in a substrate, wherein the substrate is a single-layer semiconductor substrate made of a single material;
   forming a first conductive layer in the trench;
   forming a second conductive layer on the first conductive layer, wherein the second conductive layer above the substrate and the second conductive layer below the substrate comprise different thickness; and
   forming a third conductive layer on the second conductive layer to fill the trench.

2. The method of claim 1, further comprising:
   performing a thermal anneal process after forming the third conductive layer; and
   performing a planarizing process to remove part of the third conductive layer, part of the second conductive layer, and part of the first conductive layer to form a gate structure.

3. The method of claim 1, further comprising performing a physical vapor deposition (PVD) process to form the second conductive layer.

4. The method of claim 1, wherein the second conductive layer above a top surface of the substrate comprises a first thickness and the second conductive layer on a top surface of the first conductive layer within the trench comprises a second thickness.

5. The method of claim 4, wherein the first thickness and the second thickness are different.

6. The method of claim 4, wherein the second thickness is less than the first thickness.

7. The method of claim 4, wherein the second conductive layer on a sidewall of the first conductive layer within the trench comprises a third thickness.

8. The method of claim 7, wherein the third thickness is less than the second thickness.

9. The method of claim 1, wherein the first conductive layer comprises titanium nitride (TiN).

10. The method of claim 1, wherein the second conductive layer comprises Ti.

11. The method of claim 1, wherein the third conductive layer comprises cobalt (Co).

* * * * *